US012707569B2

(12) United States Patent
Park et al.

(10) Patent No.: US 12,707,569 B2
(45) Date of Patent: Aug. 11, 2026

(54) PRINTED CIRCUIT BOARD AND SEMICONDUCTOR PACKAGE INCLUDING THE SAME

(71) Applicant: SAMSUNG ELECTRONICS CO., LTD., Suwon-si (KR)

(72) Inventors: Jin Duck Park, Suwon-si (KR); Chan-Sik Kwon, Suwon-si (KR); Yong-Seong Kim, Suwon-si (KR); In Wook Im, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 266 days.

(21) Appl. No.: 18/676,696

(22) Filed: May 29, 2024

(65) Prior Publication Data

US 2025/0168984 A1 May 22, 2025

(30) Foreign Application Priority Data

Nov. 22, 2023 (KR) ........................ 10-2023-0163363

(51) Int. Cl.
*H05K 1/00* (2006.01)
*H05K 1/11* (2006.01)
(Continued)

(52) U.S. Cl.
CPC ............. *H05K 1/181* (2013.01); *H05K 1/115* (2013.01); *H10W 70/65* (2026.01);
(Continued)

(58) Field of Classification Search
CPC . H10W 70/685; H10W 90/701; H10W 70/60; H10W 70/65; H10W 90/00;
(Continued)

(56) References Cited

U.S. PATENT DOCUMENTS 10,074,614 B2 9/2018 Gong et al.
10,553,514 B2 2/2020 Kim et al.
(Continued)

FOREIGN PATENT DOCUMENTS

CN 109449140 3/2019
KR 10-2010-0139075 12/2010

*Primary Examiner* — Pete T Lee
(74) *Attorney, Agent, or Firm* — MORGAN, LEWIS & BOCKIUS LLP

(57) ABSTRACT

A printed circuit board includes: a substrate body part including a first region and a second region, and including a first side and a second side; first upper redistribution patterns disposed on the first side in the first region; third upper redistribution patterns disposed on the first side in the second region; second upper redistribution patterns disposed on the first side and between the first and third upper redistribution patterns; connection patterns connecting the first upper redistribution patterns to the second upper redistribution patterns; a solder resist film including first recesses, second recesses, and third recesses, which respectively expose upper surfaces of the first, second and third upper redistribution patterns; and dummy wire patterns disposed within the second and third recesses and connecting the second upper redistribution patterns to the third upper redistribution patterns, wherein the first, second and third upper redistribution patterns are electrically connected to one another.

20 Claims, 16 Drawing Sheets

(51) Int. Cl.

| | |
|---|---|
| ***H05K 1/181*** | (2026.01) |
| ***H10W 70/65*** | (2026.01) |
| *H10W 72/00* | (2026.01) |
| *H10W 72/30* | (2026.01) |
| *H10W 72/50* | (2026.01) |
| *H10W 90/00* | (2026.01) |
| *H10W 90/24* | (2026.01) |

(52) U.S. Cl.

CPC .............. *H05K 2201/09781* (2013.01); *H05K 2201/10287* (2013.01); *H05K 2201/10515* (2013.01); *H10W 72/07353* (2026.01); *H10W 72/07355* (2026.01); *H10W 72/07554* (2026.01); *H10W 72/334* (2026.01); *H10W 72/3528* (2026.01); *H10W 72/547* (2026.01); *H10W 90/00* (2026.01); *H10W 90/24* (2026.01); *H10W 90/754* (2026.01)

(58) Field of Classification Search

CPC ... H10W 72/241; H10W 20/43; H10W 70/05; H10W 70/635; H10W 72/9413; H10W 70/09; H10W 70/611; H10W 74/117; H10W 90/724; H10W 72/252; H10W 72/90; H10W 72/00; H10W 72/20; H10W 90/734; H10W 20/40; H10W 20/42; H10W 42/00; H10W 70/66; H10W 72/29; H10W 20/49; H10W 72/942; H10W 74/137; H10W 90/401; H10W 20/427; H10W 72/012; H10W 72/073; H10W 72/222; H10W 72/321; H10W 72/981; H10W 72/983; H10W 74/147; H10W 90/722; H10W 70/614; H10W 90/754; H10W 70/69; H10W 70/692; H10W 74/15; H10W 20/023; H10W 20/035; H10W 20/069; H10W 20/0698; H10W 20/089; H10W 20/435; H10W 70/093; H10W 70/6528; H10W 70/68; H10W 72/072; H10W 72/874; H10W 72/884; H10W 74/00; H10W 74/016; H10W 74/019; H10W 42/121; H10W 70/095; H10W 70/099; H10W 72/0198; H10W 74/111; H10W 74/114; H10W 74/142; H10W 40/613; H10W 42/60; H10W 44/501; H10W 70/097; H10W 70/652; H10W 70/655; H10W 70/682; H10W 70/695; H10W 72/07252; H10W 72/075; H10W 72/354; H10W 72/5445; H10W 72/952; H10W 74/01; H10W 74/10; H10W 74/121; H10W 74/129; H10W 90/10; H10W 90/28; H10W 90/732; H10W 99/00; H10W 20/032; H10W 20/081; H10W 20/20; H10W 20/425; H10W 20/44; H10W 40/22; H10W 44/20; H10W 44/209; H10W 44/248; H10W 70/475; H10W 70/618; H10W 70/656; H10W 72/01225; H10W 72/01257; H10W 72/019; H10W 72/01923; H10W 72/07236; H10W 72/07253; H10W 72/07254; H10W 72/07353; H10W 72/07355; H10W 72/07554; H10W 72/221; H10W 72/223; H10W 72/227; H10W 72/234; H10W 72/242; H10W 72/244; H10W 72/245; H10W 72/247; H10W 72/255; H10W 72/30; H10W 72/334; H10W 72/3528; H10W 72/50; H10W 72/547; H10W 72/551; H10W 72/851; H10W 72/922; H10W 72/9223; H10W 72/923; H10W 72/925; H10W 72/953; H10W 74/014; H10W 74/47; H10W 90/24; H10W 90/794; H05K 1/111; H05K 1/115; H05K 1/116; H05K 1/0296; H05K 1/113; H05K 2201/09227; H05K 1/0266; H05K 1/0268; H05K 1/0306; H05K 1/181; H05K 2201/094; H05K 2201/09409; H05K 2201/09609; H05K 2201/09672; H05K 2201/09709; H05K 2203/025; H05K 2203/0353; H05K 2203/072; H05K 2203/0723; H05K 2203/0766; H05K 2203/095; H05K 2203/162; H05K 3/0029; H05K 3/0032; H05K 3/045; H05K 3/244; H05K 3/368; H05K 3/423; H05K 1/02; H05K 2201/09509; H05K 1/18; H05K 2201/0394; H05K 2201/09527; H05K 2201/09536; H05K 2201/096; H05K 3/284; H05K 3/4602; H05K 3/462; H05K 3/4623; H05K 3/4682; H05K 1/0209; H05K 1/0256; H05K 1/0262; H05K 1/03; H05K 1/0313; H05K 1/05; H05K 1/142; H05K 1/185; H05K 2201/09618; H05K 2201/09781; H05K 2201/0979; H05K 2201/10166; H05K 2201/10287; H05K 2201/10515; H05K 2201/10522; H05K 2201/10545; H05K 2201/10674; H05K 2201/10704; H05K 2201/10734; H05K 3/061; H05K 3/107; H05K 3/3415; H05K 3/3426; H05K 3/4644; H05K 3/4655; H05K 3/4694; H05K 3/469

See application file for complete search history.

(56) References Cited

U.S. PATENT DOCUMENTS

| | | | | |
|---|---|---|---|---|
| 10,903,177 | B2 | 1/2021 | Yoo et al. | |
| 11,329,013 | B2 | 5/2022 | Cotronakis et al. | |
| 2011/0044017 | A1* | 2/2011 | Ono ...................... | H10W 70/60 361/767 |
| 2011/0089575 | A1* | 4/2011 | Lee ..................... | H10W 74/114 257/777 |
| 2019/0259742 | A1* | 8/2019 | Han ...................... | H10W 90/00 |
| 2021/0175182 | A1 | 6/2021 | Paek et al. | |

* cited by examiner

PRINTED CIRCUIT BOARD AND SEMICONDUCTOR PACKAGE INCLUDING THE SAME

CROSS-REFERENCE TO RELATED APPLICATION

This application claims priority under 35 USC § 119 to Korean Patent Application No. 10-2023-0163363 filed on Nov. 22, 2023 in the Korean Intellectual Property Office, the disclosure of which is incorporated by reference herein in its entirety.

TECHNICAL FIELD

Embodiments of the present inventive concept relate to a printed circuit board (PCB) and a semiconductor package including the same, and more particularly, to a PCB including upper redistribution patterns, and a semiconductor package including the PCB.

DISCUSSION OF THE RELATED ART

Printed circuit boards (PCBs) may be used as the package substrates of semiconductor packages or package boards on which the semiconductor packages are mounted. With the continuous development of the electronics industry, there is an increasing demand for electronic components with high-functionality, high-speed, and high miniaturization. In response to this trend, patterns formed on PCBs are becoming more refined.

In addition, as PCBs become more miniaturized, the frequency of an electrostatic discharge (ESD) defect occurring on a PCB is increasing.

SUMMARY

According to embodiments of the present inventive concept, a printed circuit board (PCB) includes: a substrate body part including a first region and a second region, and including a first side and a second side, which are opposite to each other in a first direction; first upper redistribution patterns disposed on the first side and in the first region; third upper redistribution patterns disposed on the first side and in the second region; second upper redistribution patterns disposed on the first side and interposed between the first upper redistribution patterns and the third upper redistribution patterns; connection patterns connecting the first upper redistribution patterns and the second upper redistribution patterns to each other, and disposed between the first upper redistribution patterns and the second upper redistribution patterns; a solder resist film including first recesses, second recesses, and third recesses, which respectively expose upper surfaces of the first upper redistribution patterns, upper surfaces of the second upper redistribution patterns, and upper surfaces of the third upper redistribution patterns; and dummy wire patterns disposed within the second recesses and the third recesses and connecting the second upper redistribution patterns and the third upper redistribution patterns to each other, wherein the first upper redistribution patterns, the second upper redistribution patterns, and the third upper redistribution patterns are electrically connected to one another.

According to embodiments of the present inventive concept, a semiconductor package includes: a printed circuit board (PCB); a die disposed on the PCB and connected to the PCB; and a plurality of connection terminals disposed on the PCB, wherein the PCB includes: a substrate body part including a first side and a second side that are opposite to each other in a first direction; first upper redistribution patterns disposed on the first side of the substrate body part; second upper redistribution patterns disposed on the first side of the substrate body part; a first solder resist film disposed on the first side of the substrate body part and including first recesses and second recesses that expose upper surfaces of the first upper redistribution patterns and upper surfaces of the second upper redistribution patterns; wire patterns connecting pads of the die to the first upper redistribution patterns; and dummy wire patterns disposed in the second recesses and connected to the second upper redistribution patterns, wherein the first upper redistribution patterns and the second upper redistribution patterns are electrically connected to one another.

According to embodiments of the present inventive concept, a semiconductor package includes: a printed circuit board (PCB); a die disposed on the PCB and connected to the PCB; and a plurality of connection terminals connected to the PCB, wherein the PCB includes: a substrate body part including a first side and a second side that are opposite to each other in a first direction; upper redistribution patterns disposed on the first side of the substrate body part; connection patterns disposed on sides of the upper redistribution patterns; a first solder resist film disposed on the first side of the substrate body part and including recesses that expose upper surfaces of the upper redistribution patterns; and wire patterns partially disposed in the recesses and connecting pads of the die to the upper redistribution patterns, wherein a depth of each of the connection patterns in the first direction is substantially the same as a depth of each of the upper redistribution patterns in the first direction, and a width of each of the connection patterns in a second direction, which intersects the first direction, is smaller than a width of each of the upper redistribution patterns in the second direction.

BRIEF DESCRIPTION OF THE DRAWINGS

The above and features of the present inventive concept will become more apparent by describing in detail example embodiments thereof with reference to the attached drawings, in which.

DETAILED DESCRIPTION OF THE EMBODIMENTS

Figure 1:
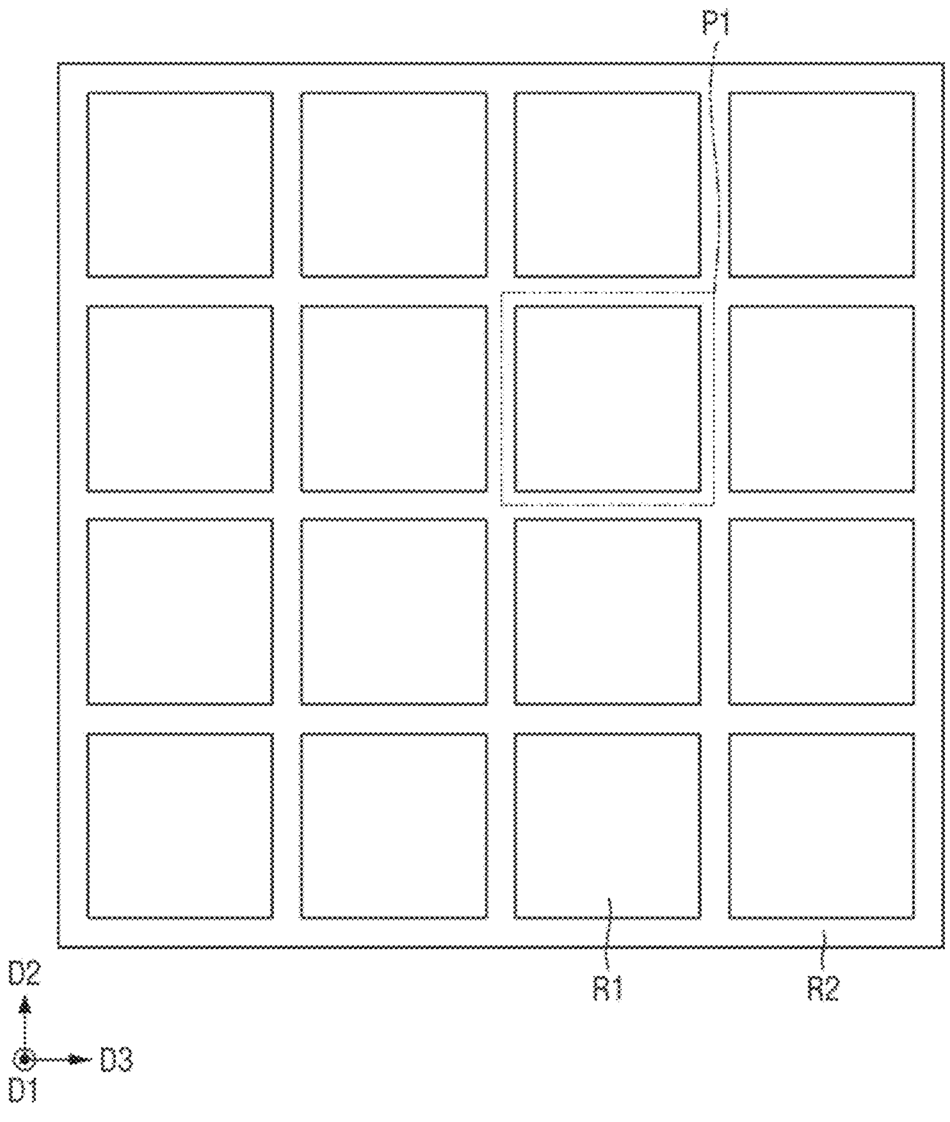
FIG. 1 is a plan view illustrating a PCB according to embodiments of the present inventive concept.

In this specification, terms such as first, second, etc., are used to describe various elements or components, but these elements or components are not limited by these terms. These terms are used merely to distinguish one element or component from another. Therefore, in the description that follows, a first element or component may also be a second element or component without departing from the spirit and scope of the present inventive concept.

In the specification and figures, like reference numerals may denote like elements or features, and thus, redundant descriptions may be omitted or briefly discussed.

Hereinafter, a printed circuit board (PCB) according to embodiments of the present inventive concept will be described with reference to FIGS. 1 through 5.

Figure 2:
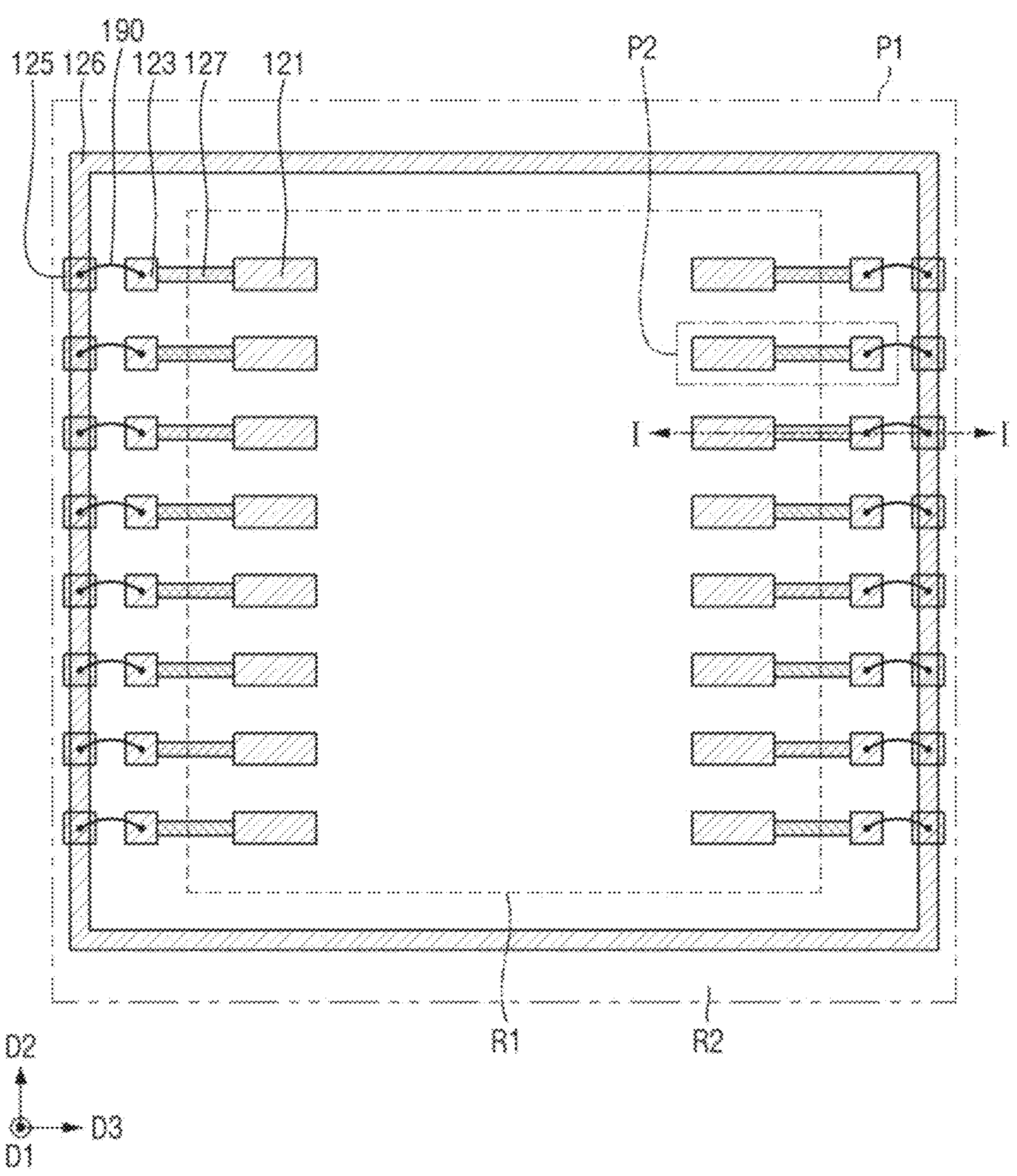
FIG. 2 is an enlarged plan view of area P1 of FIG. 1.
Figure 3:
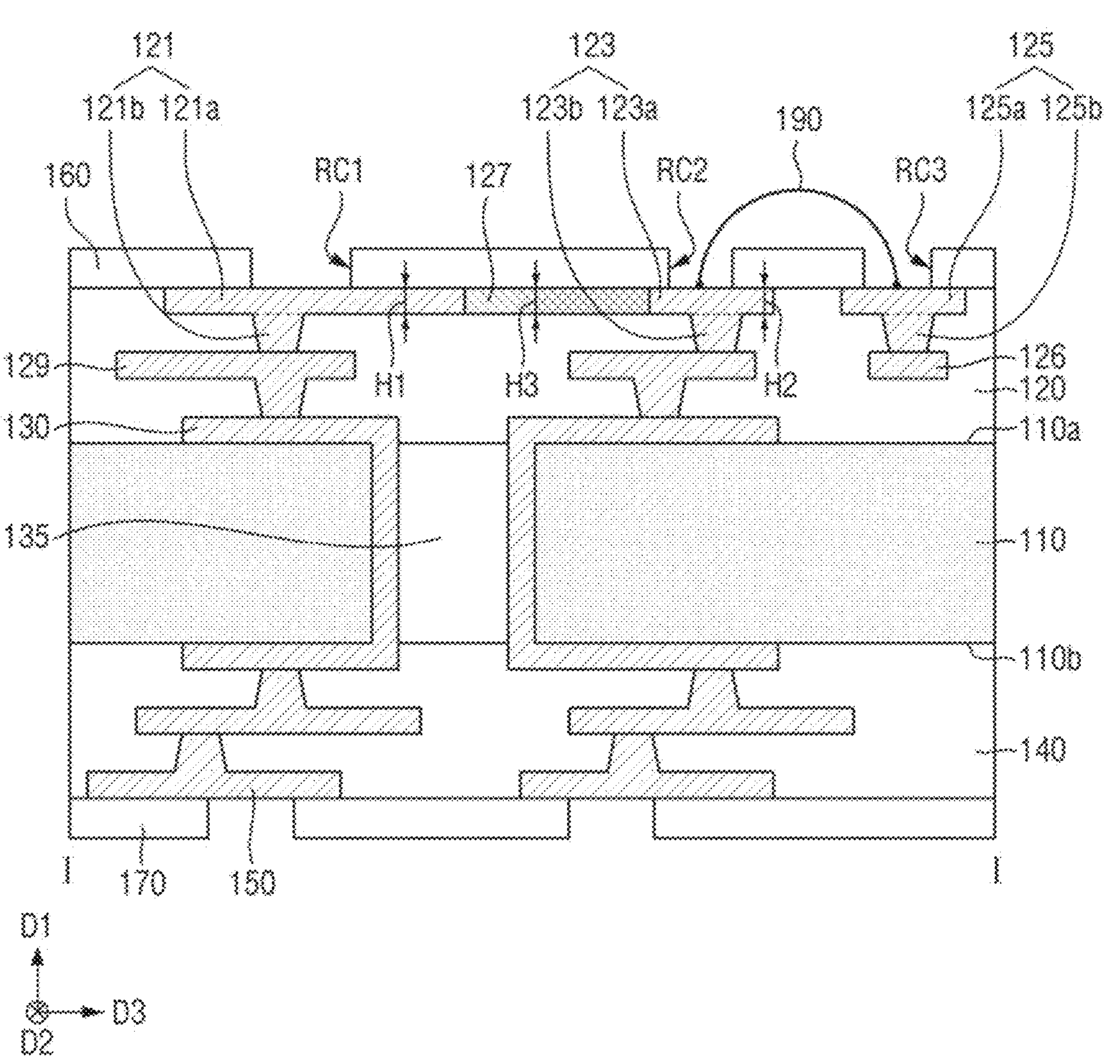
FIG. 3 is a cross-sectional view taken along line I-I of FIG. 2.
Figure 4:
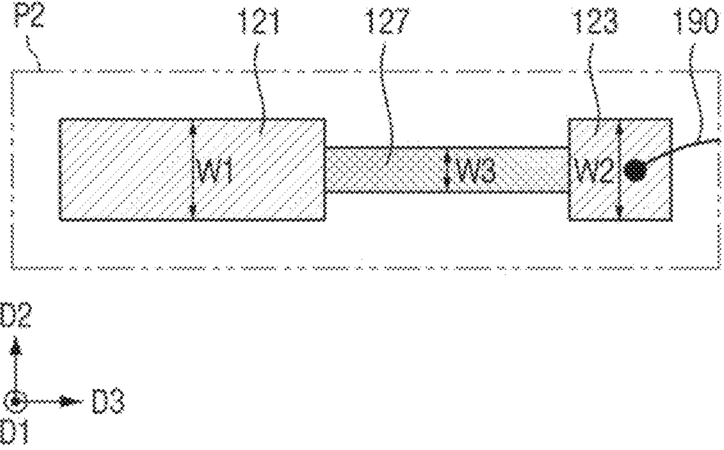
FIG. 4 is an enlarged plan view of area P2 of FIG. 2.

FIG. 1 is a plan view illustrating a PCB according to embodiments of the present inventive concept. FIG. 2 is an enlarged plan view of area P1 of FIG. 1. FIG. 3 is a cross-sectional view taken along line I-I of FIG. 2. FIG. 4 is an enlarged plan view of area P2 of FIG. 2.

Referring to FIGS. 1 through 4, a PCB 100 may include first regions R1 and a second region R2. The first regions R1 may be defined by the second region R2. The first regions R1 may be arranged in a grid pattern or matrix pattern. For example, a plurality of first regions R1 may be spaced apart from one another in second and third directions D2 and D3 within a plane including the second and third directions D2 and D3. The second region R2 may be arranged between the first regions R1. In this specification, a first direction D1, the second direction D2, and the third direction D3 may be substantially perpendicular to one another. The second region R2 may have a grid shape in which the first region R1 is provided.

In embodiments of the present inventive concept, the first regions R1 may be areas where at least one die is mounted when manufacturing semiconductor packages. The second region R2 may be an area that is cut when manufacturing the semiconductor packages. The width of the second region R2 may be about 200 μm, but the present inventive concept is not limited thereto.

Referring to FIGS. 2 and 3, the PCB 100 may include a substrate body part 110, first upper redistribution patterns 121, second upper redistribution patterns 123, third upper redistribution patterns 125, fourth upper redistribution patterns 129, a fifth upper redistribution pattern 126, lower redistribution patterns 150, a first solder resist film 160, a second solder resist film 170, and connection patterns 127.

The substrate body part 110 may include first and second sides 110*a* and 110*b*, which are opposite to each other in the first direction D1. The substrate body part 110 may be formed as, for example, an epoxy-containing film. For example, the substrate body part 110 may be formed of a thermosetting resin such as an epoxy resin, a thermoplastic resin such as polyimide, or a resin impregnated with a reinforcement such as glass fiber and/or an inorganic filler (e.g., prepreg), and/or a photo-curable resin, but the present inventive concept is not limited thereto.

An upper insulating film 120 may be disposed on the first side 110*a* of the substrate body part 110. For example, the upper insulating film 120 may be formed as a photo-imageable dielectric (PID) film, a silicon oxide film, a silicon nitride film, or a silicon oxynitride film. For example, the upper insulating film 120 may include a photosensitive polymer. The photosensitive polymer may be formed of at least one of, for example, photosensitive polyimide, polybenzoxazole, a phenolic polymer, and/or a benzocyclobutene-based polymer, but the present inventive concept is not limited thereto.

One or more upper redistribution patterns may be disposed in the upper insulating film 120. The upper redistribution patterns may include the first upper redistribution patterns 121, the second upper redistribution patterns 123, the third upper redistribution patterns 125, the fourth upper redistribution patterns 129, and the fifth upper redistribution pattern 126. The first upper redistribution patterns 121, the second upper redistribution patterns 123, and the third upper redistribution patterns 125 may be arranged at substantially the same or the same level. The fourth upper redistribution patterns 129 may be arranged at a different level from the first upper redistribution patterns 121, the second upper redistribution patterns 123, and the third upper redistribution patterns 125. For example, the level of the fourth upper redistribution patterns 129 may be disposed lower than the level of the first upper redistribution patterns 121, second upper redistribution patterns 123, and third upper redistribution patterns 125 relative to the first side 110*a*. For example, the level of the fifth upper redistribution pattern 126 may be lower than the level of the first upper redistribution patterns 121, second upper redistribution patterns 123, and third upper redistribution patterns 125, relative to the first side 110*a*. As another example, an upper surface of the fifth upper redistribution pattern 126 may be disposed at substantially the same or the same level as upper surfaces of the fourth upper redistribution patterns 129, and a level of a lower surface of the fifth upper redistribution pattern 126 may be disposed above a level of lower surfaces of the fourth upper redistribution patterns 129.

In embodiments of the present inventive concept, the first upper redistribution patterns 121 may be disposed on a first region R1. The first upper redistribution patterns 121 may be arranged in the second direction D2 on the plane including the second and third directions D2 and D3. For example, one or more first upper redistribution patterns 121 may be spaced apart from one another in the second direction D2. Furthermore, arrays of first upper redistribution patterns 121 that extend in the second direction D2 may be disposed on opposing sides of the first region R1. However, the arrangement and number of first upper redistribution patterns 121 are not particularly limited thereto.

The first upper redistribution patterns 121 may include a first wiring 121*a* and first vias 121*b*. The first wiring 121*a* may extend in the third direction D3. The first vias 121*b* may be connected to the lower surface of the first wiring 121*a* and extend in the first direction D1 toward the first side 110*a* in the upper insulating film 120. The lower surface of the first wiring 121*a* may face the first side 110*a* of the substrate body part 110.

The second upper redistribution patterns 123 may be disposed in the second region R2. The second upper redistribution patterns 123 may be arranged in the second direction D2 on the plane including the second D2 and third D3 directions. For example, one or more second upper redistribution patterns 123 may be spaced apart from one another in the second direction D2. One or more second upper redistribution patterns 123 may be arranged spaced apart from the first upper redistribution patterns 121 in the third direction D3. Additionally, arrays of second upper redistribution patterns 123 that extend in the second direction D2 may be disposed on opposing sides of the second region R2. However, the arrangement and number of second upper redistribution patterns 123 are not particularly limited thereto.

The second upper redistribution patterns 123 may include a second wiring 123*a* and second vias 123*b*. The second wiring 123*a* may extend in the third direction D3. The second vias 123*b* may be connected to the lower surface of the second wiring 123*a* and extend in the first direction D1 toward the first side 110*a* in the upper insulating film 120. The lower surface of the second wiring 123*a* may face the first side 110*a* of the substrate body part 110.

The third upper redistribution patterns 125 may be disposed in the second region R2. The third upper redistribution patterns 125 may be arranged in the second direction D2 on the plane including the second and third directions D2 and D3. For example, one or more third upper redistribution patterns 125 may be spaced apart from one another in the second direction D2. One or more third upper redistribution patterns 125 may be spaced apart from the second upper redistribution patterns 123 in the third direction D3. Additionally, arrays of third upper redistribution patterns 125 that extend in the second direction D2 may be disposed on opposing sides of the first region R1. However, the arrangement and number of third upper redistribution patterns 125 are not particularly limited thereto.

The third upper redistribution patterns 125 may include a third wiring 125*a* and third vias 125*b*. The third wiring 125*a* may extend in the third direction D3. The third vias 125*b* may be connected to the lower surface of the third wiring 125*a* and extend in the first direction D1 toward the first side 110*a* in the upper insulating film 120. The lower surface of the third wiring 125*a* may face the first side 110*a* of the substrate body part 110.

The fifth upper redistribution pattern 126 may be disposed in the second region R2. The fifth upper redistribution pattern 126 may be connected to all the third upper redistribution patterns 125. For example, the fifth upper redistribution pattern 126 may be arranged with a rectangular shape on the plane including the second and third directions D2 and D3 and may be disposed below all the third upper redistribution patterns 125. Thus, all the third upper redistribution patterns 125 may be electrically connected to one another.

The connection patterns 127 may be disposed at the boundary between the first region R1 and the second region R2. The connection patterns 127 may be disposed between the first upper redistribution patterns 121 and the second upper redistribution patterns 123. Sides of the connection patterns 127 may be connected to the first upper redistribution patterns 121, and other sides of the connection patterns 127 may be connected to the second upper redistribution patterns 123. The connection patterns 127 may be arranged in the second direction D2 on the plane including the second and third directions D2 and D3. For example, the sides of the connection patterns 127 that are connected to the first upper redistribution pattern 121 may be disposed in the first region R1, and the sides of the connection patterns 127 that are connected to the second upper redistribution patterns 123 may be disposed in the second region R2.

In embodiments of the present inventive concept, the first upper redistribution patterns 121, the connection patterns 127, and the second upper redistribution patterns 123 may be formed through the same process. Therefore, referring to FIG. 3, a depth H1 of the first upper redistribution patterns 121 in the first direction D1, a depth H2 of the second upper redistribution patterns 123 in the first direction D1, and a depth H3 of the connection patterns 127 in the first direction D1 may be substantially the same or the same as one another.

However, the width of the first upper redistribution patterns 121 and the width of the connection patterns 127 may be different from each other. In addition, the width of the second upper redistribution patterns 123 and the width of the connection patterns 127 may be different from each other.

For example, referring to FIG. 4, the first upper redistribution patterns 121 may have a first width W1 in the second direction D2. The first width W1 may be the distance between the long sides of each of the first upper redistribution patterns 121 on the plane including the second and third directions D2 and D3. The long sides of each of the first upper redistribution patterns 121 may extend in the third direction D3.

The second upper redistribution patterns 123 may have a second width W2 in the second direction D2. The second width W2 may be the distance between the long sides of each of the second upper redistribution patterns 123 on the plane including the second and third directions D2 and D3. The long sides of each of the second upper redistribution patterns 123 may extend in the third direction D3.

The connection patterns 127 may have a third width W3 in the second direction D2. The third width W3 may be the distance between the long sides of each of the connection patterns 127 on the plane including the second and third directions D2 and D3. The long sides of each of the connection patterns 127 may extend in the third direction D3.

The first width W1 is greater than the third width W3. In addition, the second width W2 is greater than the third width W3. For example, the width of the connection patterns 127 may be smaller than each of the width of the first upper redistribution patterns 121 and the width of the second upper redistribution patterns 123. The first and second widths W1 and W2 may be substantially the same or the same as each other. However, the present inventive concept is not limited thereto. For example, the first width W1 may be greater than the second width W2.

The fourth upper redistribution patterns 129 may be connected to the first vias 121*b* of the first upper redistribution patterns 121 and/or the second vias 123*b* of the second upper redistribution patterns 123. The first vias 121*b* and/or the second vias 123*b* may contact the upper surfaces of the fourth upper redistribution patterns 129. The upper surfaces of the fourth upper redistribution patterns 129 may face the first solder resist film 160. In an embodiment of the present inventive concept, the fourth upper redistribution patterns 129 may be connected to the third vias 125*b* of the third upper redistribution patterns 125.

Each of the first upper redistribution patterns 121, the second upper redistribution patterns 123, the third upper redistribution patterns 125, and the fifth upper redistribution pattern 126 may include a conductive material. For example, the first upper redistribution patterns 121, the second upper redistribution patterns 123, the third upper redistribution patterns 125, and the fifth upper redistribution pattern 126 may include copper (Cu), but the present inventive concept is not limited thereto.

The connection patterns 127 may include a conductive material. For example, the connection patterns 127 may include Cu, but the present inventive concept is not limited thereto.

The first solder resist film 160 may be disposed on the first side 110*a* of the substrate body part 110. The first solder resist film 160 may cover the upper insulating film 120. The first solder resist film 160 may cover at least parts of the upper surfaces of the first upper redistribution patterns 121, second upper redistribution patterns 123, and third upper redistribution patterns 125. The first solder resist film 160 may completely cover the upper surfaces of the connection patterns 127.

The first solder resist film 160 may be, for example, a photosensitive solder resist (PSR) film. For example, the first solder resist film 160 may include a material such as epoxy, acrylic, or an inorganic filler. However, the present inventive concept is not limited thereto.

The first solder resist film 160 may include first recesses RC1, second recesses RC2, and third recesses RC3. The first recesses RC1 may expose at least parts of the upper surfaces of the first upper redistribution patterns 121. For example, the width of each of the first recesses RC1 in the third direction D3 may be smaller than the width of each of the upper surfaces of the first upper redistribution patterns 121 in the third direction D3.

The second recesses RC2 may expose at least parts of the upper surfaces of the second upper redistribution patterns 123. For example, the width of each of the second recesses RC2 in the third direction D3 may be smaller than the width of each of the upper surfaces of the second upper redistribution patterns 123 in the third direction D3.

The third recesses RC3 may expose at least parts of the upper surfaces of the third upper redistribution patterns 125. For example, the width of each of the third recesses RC3 in the third direction D3 may be smaller than the width of each of the upper surfaces of the third upper redistribution patterns 125 in the third direction D3.

In embodiments of the present inventive concept, the exposed upper surfaces of the first upper redistribution patterns 121 by the first recesses RC1 may be coated with gold (Au) and/or nickel (Ni). Similarly, the exposed upper surfaces of the second upper redistribution patterns 123 by the second recesses RC2 may be coated with Au and/or Ni. The exposed upper surfaces of the third upper redistribution patterns 125 by the third recesses RC3 may also be coated with Au and/or Ni. However, the present inventive concept is not limited thereto.

In embodiments of the present inventive concept, second stack bonding parts may be disposed on the upper surfaces of the second upper redistribution patterns 123, within the second recesses RC2, and third stack bonding parts may be disposed on the upper surfaces of the third upper redistribution patterns 125, within the third recesses RC3. The second stack bonding parts and the third stack bonding parts may be connected to one another by dummy wire patterns 190. For example, sides of the dummy wire patterns 190 may be connected to the second stack bonding parts, and other sides of the dummy wire patterns 190 may be connected to the third stack bonding parts. Parts of the dummy wire patterns 190 may be disposed within the second recesses RC2, and other parts of the dummy wire patterns 190 may be disposed within the third recesses RC3. For example, first stack bonding parts may also be disposed within the first recesses RC1.

In embodiments of the present inventive concept, the first upper redistribution patterns 121, the second upper redistribution patterns 123, and the third upper redistribution patterns 125 may be electrically connected to one another through the connection patterns 127 and the dummy wire patterns 190. Therefore, when manufacturing a semiconductor package using the PCB 100, electrostatic discharge (ESD) defects may be prevented. Since the first upper redistribution patterns 121, the second upper redistribution patterns 123, and the third upper redistribution patterns 125 are electrically connected to one another, ESD can be dispersed. As a result, a semiconductor package with increased reliability can be fabricated.

In embodiments of the present inventive concept, a lower insulating film 140 and lower redistribution patterns 150 may be disposed on the second side 110*b* of the substrate body part 110.

The lower insulating film 140 may be formed as, for example, a PID film, a silicon oxide film, a silicon nitride film, or a silicon oxynitride film. For example, the lower insulating film 140 may include a photosensitive polymer. The photosensitive polymer may be formed of at least one of, for example, photosensitive polyimide, polybenzoxazole, a phenolic polymer, and/or a benzocyclobutene-based polymer. However, the present inventive concept is not limited to this.

A plurality of lower redistribution patterns 150 may be disposed within the lower insulating film 140. The lower redistribution patterns 150 may include wiring and vias.

The wirings of the lower redistribution patterns 150 may extend in the third direction D3. The vias of the lower redistribution patterns 150 may be connected to the upper surface of the wiring and extend toward the second side 110*b*. For example, the vias of the lower redistribution patterns 150 may be disposed on the upper surfaces of the wirings of the lower redistribution patterns 150. For example, the via that is disposed on the upper surface of the wiring of the lower redistribution pattern 150 may be integrally formed with that wiring. The upper surfaces of the lower redistribution patterns 150 may face the second side 110*b* of the substrate body part 110.

The lower redistribution patterns 150 may include a conductive material. For example, the lower redistribution patterns 150 may include Cu, but the present inventive concept is not limited thereto.

The second solder resist film 170 may be disposed on the second side 110*b* of the substrate body part 110. The second solder resist film 170 may cover the lower insulating film 140. The second solder resist film 170 may cover at least parts of the lower surfaces of the lower redistribution patterns 150. The second solder resist film 170 may expose at least parts of the lower surfaces of the lower redistribution patterns 150. Through the exposed spaces, connection terminals may be connected to the lower redistribution patterns 150 when manufacturing a semiconductor package. The lower surfaces of the lower redistribution patterns 150 may face the second solder resist film 170.

The second solder resist film 170 may be, for example, a photosensitive solder resist (PSR) film. For example, the second solder resist film 170 may include a material such as epoxy, acrylic, or an inorganic filler. However, the present inventive concept is not limited to thereto.

The PCB 100 may further include a through-insulating film 135 and through-conductive patterns 130.

The through-insulating film 135 may penetrate the substrate body part 110 in the first direction D1. The through-insulating film 135 may be formed to create the through-conductive patterns 130. The through-conductive patterns 130 may be formed to connect the first upper redistribution patterns 121, the second upper redistribution patterns 123, the third upper redistribution patterns 125, and the fourth upper redistribution patterns 129 with the lower redistribution patterns 150.

The through-conductive patterns 130 may be formed along the sidewalls of the through-insulating film 135, and along the first and second sides 110*a* and 110*b* of the substrate body part 110. The through-conductive patterns 130 may penetrate the substrate body part 110. In addition, through-conductive patterns 130 on the first side 110*a* may be connected to the fourth upper redistribution patterns 129. Through-conductive patterns 130 on the second side 110*b* may be connected to the lower redistribution patterns 150. Accordingly, the lower redistribution patterns 150, the first upper redistribution patterns 121, the second upper redistribution patterns 123, the third upper redistribution patterns 125, and the fourth upper redistribution patterns 129 may be electrically connected to one another.

The through-insulating film 135 may include an insulating material. For example, the through-insulating film 135 may be formed as a silicon oxide film, but the present inventive concept is not limited thereto. The through-conductive patterns 130 may include a conductive material. For example, the through-conductive patterns 130 may include Cu, but the present inventive concept is not limited thereto.

Figure 5:
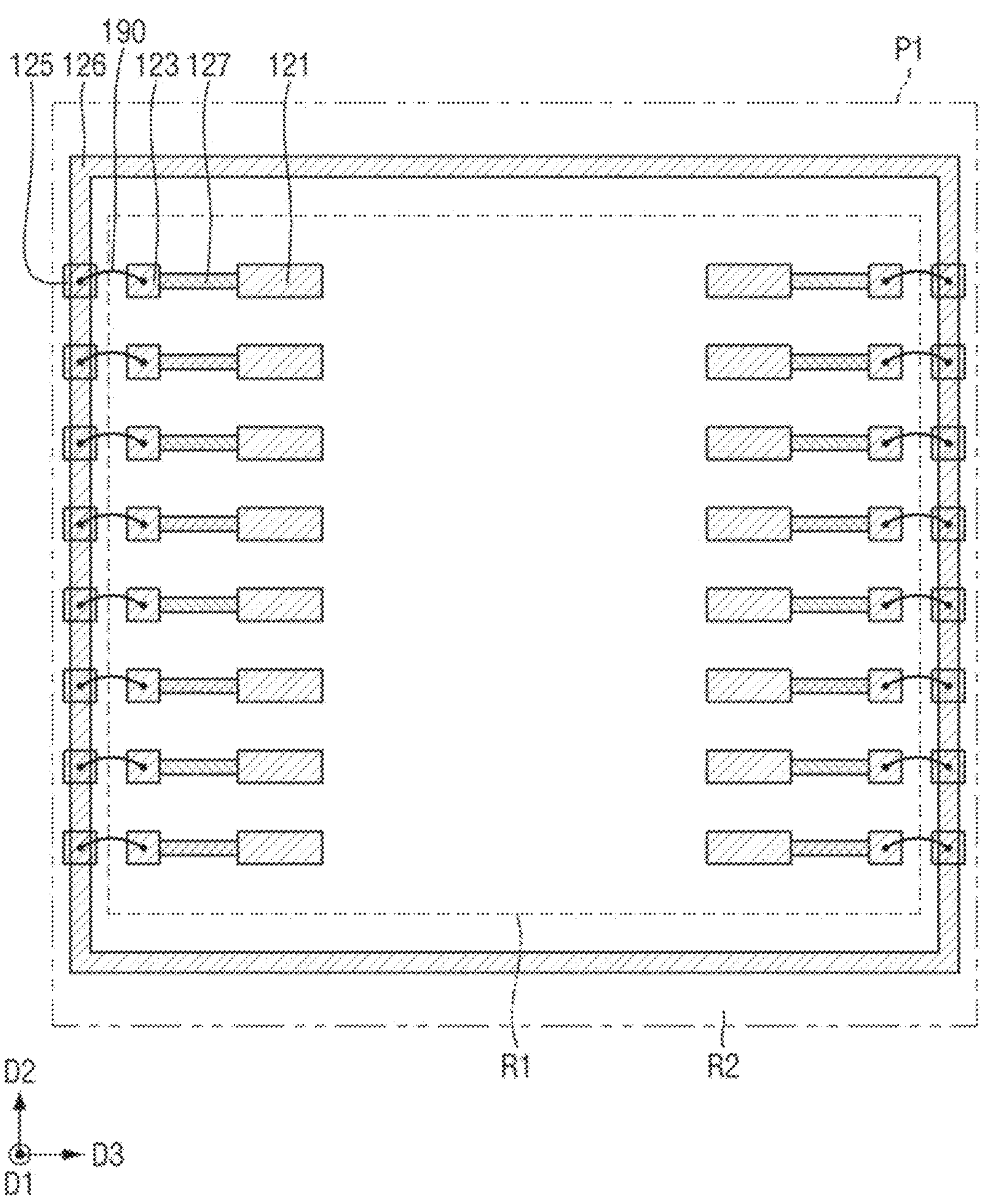
FIG. 5 is a layout view illustrating a PCB according to embodiments of the present inventive concept.

A PCB according to embodiments of the present inventive concept will hereinafter be described with reference to FIG. 5. For convenience, content that overlaps with what has been described above with reference to FIGS. 1 to 4 will be briefly explained or omitted. FIG. 5 is a layout view illustrating a PCB 100 according to embodiments of the present inventive concept.

Referring to FIG. 5, second upper redistribution patterns 123 may be disposed in a first region R1. Connection patterns 127 may be disposed in the first region R1. In this case, third upper redistribution patterns 125 may be disposed in a second region R2. Dummy wire patterns 190 may be disposed at the boundary between the first and second regions R1 and R2. For example, parts of the dummy wire patterns 190 may be disposed in the first region R1, and other parts of the dummy wire patterns 190 may be disposed in the second region R2.

Therefore, when manufacturing a semiconductor package using the PCB 100 of FIG. 5, the semiconductor package may include parts of the second upper redistribution patterns 123 and parts of the dummy wire patterns 190.

A semiconductor package including a PCB according to embodiments of the present inventive concept will hereinafter be described with reference to FIGS. 6 through 16. The semiconductor package according to embodiments of the present inventive concept may include the PCB 100 of any one of FIGS. 1 through 5. The semiconductor package according to embodiments of the present inventive concept will hereinafter be described with reference to FIGS. 6 through 9.

Figure 6:
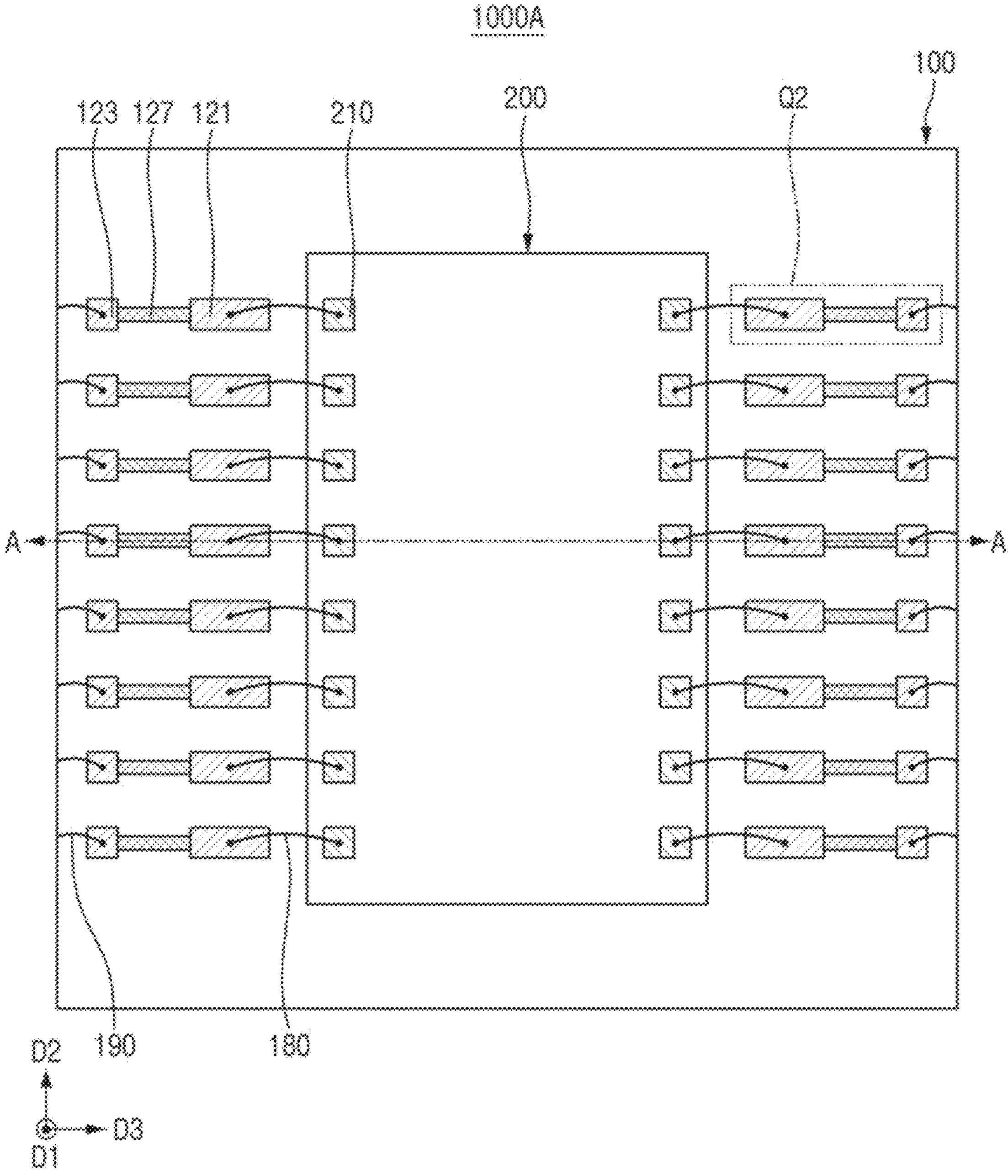
FIG. 6 is a plan view illustrating a semiconductor package according to embodiments of the present inventive concept.
Figure 7:
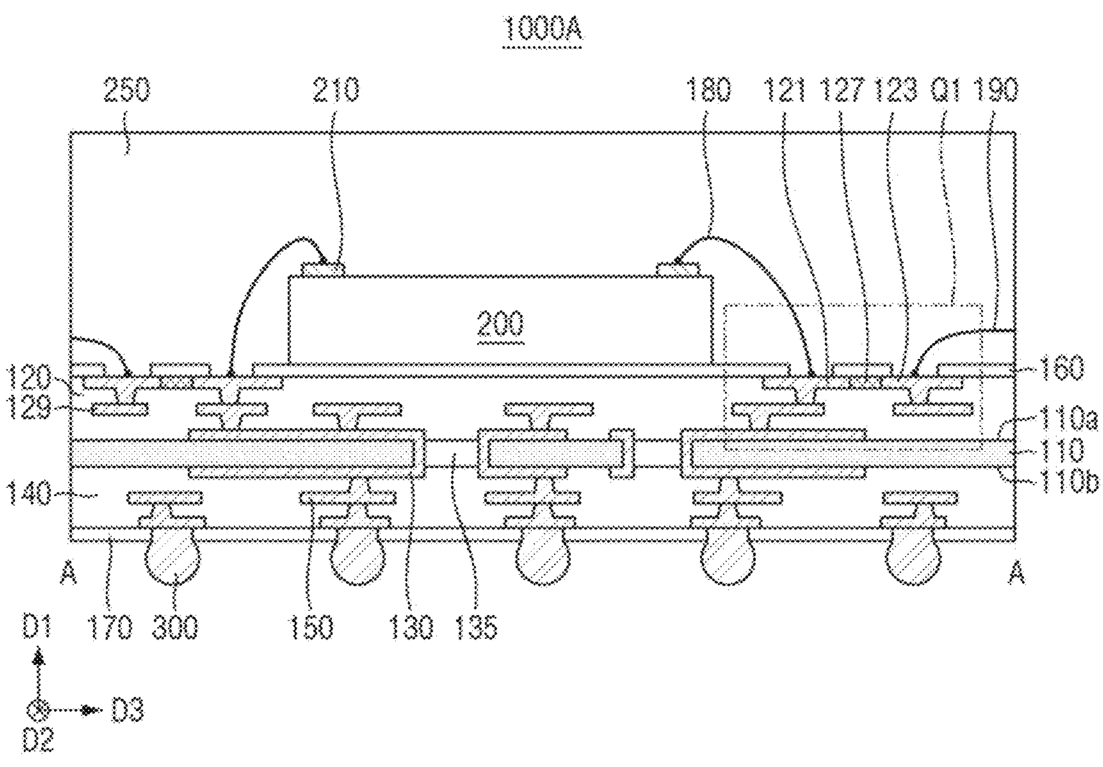
FIG. 7 is a cross-sectional view taken along line A-A of FIG. 6.
Figure 8:
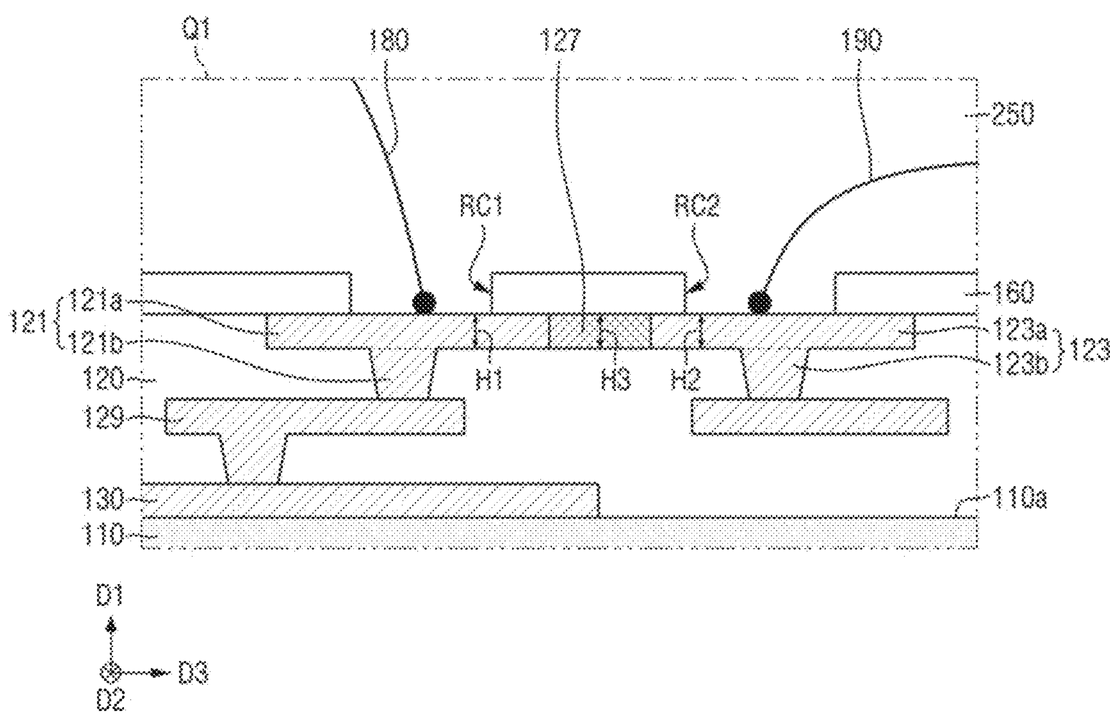
FIG. 8 is an enlarged cross-sectional view of area Q1 of FIG. 7.
Figure 9:
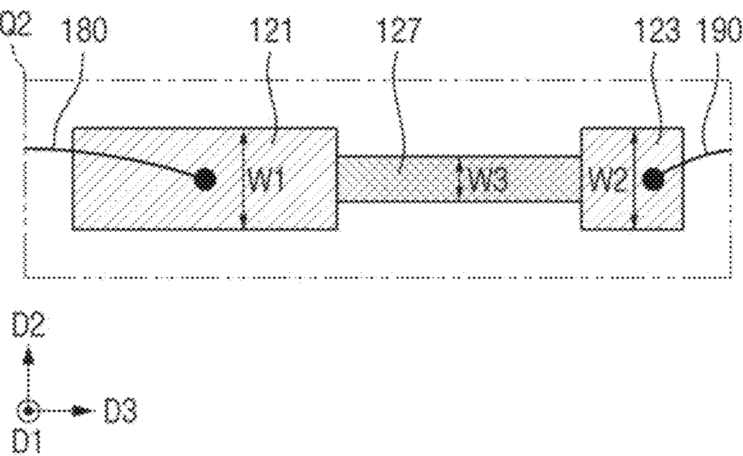
FIG. 9 is an enlarged plan view of area Q2 of FIG. 6.

FIG. 6 is a plan view illustrating a semiconductor package according to embodiments of the present inventive concept. FIG. 7 is a cross-sectional view taken along line A-A of FIG. 6. FIG. 8 is an enlarged cross-sectional view of area Q1 of FIG. 7. FIG. 9 is an enlarged plan view of area Q2 of FIG. 6.

Referring to FIGS. 6 through 9, a semiconductor package 1000A may include a PCB 100, a die 200, a mold film 250, and connection terminals 300.

The PCB 100 may correspond to any one of FIGS. 1 through 5. The PCB 100 may include a substrate body part 110, an upper insulating film 120, first upper redistribution patterns 121, second upper redistribution patterns 123, fourth upper redistribution patterns 129, connection patterns 127, a lower insulating film 140, lower redistribution patterns 150, a first solder resist film 160, and a second solder resist film 170.

The substrate body part 110 may include first and second sides 110*a* and 110*b*, which are opposite to each other in a first direction D1. The substrate body part 110 may be formed as, for example, an epoxy-containing film. For example, the substrate body part 110 may be formed of a thermosetting resin such as an epoxy resin, a thermoplastic resin such as polyimide, or a resin impregnated with a reinforcement such as glass fiber and/or an inorganic filler (e.g., prepreg), and/or a photo-curable resin, but the present inventive concept is not limited thereto.

The upper insulating film 120 may be disposed on the first side 110*a* of the substrate body part 110. One or more upper redistribution patterns may be disposed within the upper insulating film 120. The upper redistribution patterns may include the first upper redistribution patterns 121, the second upper redistribution patterns 123, and the fourth upper redistribution patterns 129. The PCB 100 of the semiconductor package 1000A does not include third upper redistribution patterns ("125" of FIG. 3) because the third upper redistribution patterns may have been cut off during the fabrication of the semiconductor package 1000A.

The first upper redistribution patterns 121 may include a first wiring 121*a* and first vias 121*b*. The first wiring 121*a* may extend in a third direction D3. The first vias 121*b* may be connected to the lower surface of the first wiring 121*a* and extend in the first direction D1 toward the first side 110*a*.

The second upper redistribution patterns 123 may include a second wiring 123*a* and second vias 123*b*. The second wiring 123*a* may extend in the third direction D3. The second vias 123*b* may be connected to the lower surface of the second wiring 123*a* and extend in the first direction D1 toward the first side 110*a*.

The connection patterns 127 may be disposed between the first upper redistribution patterns 121 and the second upper redistribution patterns 123. Sides of the connection patterns 127 may be connected to the first upper redistribution patterns 121, and other sides of the connection patterns 127 may be connected to the second upper redistribution patterns 123.

A depth H1 of the first upper redistribution patterns 121 in the first direction D1, a depth H2 of the second upper redistribution patterns 123 in the first direction D1, and a depth H3 of the connection patterns 127 in the first direction D1 may be substantially the same or the same as one another because the first upper redistribution patterns 121, the second upper redistribution patterns 123, and the connection patterns 127 are formed through the same process.

However, the width of the first upper redistribution patterns 121 and the width of the connection patterns 127 may be different from each other. Similarly, the width of the second upper redistribution patterns 123 and the width of the connection patterns 127 may be different from each other.

For example, as illustrated in FIG. 9, the first upper redistribution patterns 121 may have a first width W1 in a second direction D2. The second upper redistribution patterns 123 may have a second width W2 in the second direction D2, and the connection patterns 127 may have a third width W3 in the second direction D2.

The first width W1 is greater than the third width W3. In addition, the second width W2 is greater than the third width W3. Thus, the width of the connection patterns 127 may be smaller than each of the width of the first upper redistribution patterns 121 and the width of the second upper redistribution patterns 123. The first and second widths W1 and W2 may be substantially the same or the same as each other. However, the present inventive concept is not limited to this.

In embodiments of the present inventive concept, the first upper redistribution patterns 121 and the second upper redistribution patterns 123 are electrically connected to one another through the connection patterns 127. Therefore, the frequency at which ESD defects may occur in the semiconductor package 1000A can be reduced.

The die 200 is disposed on the PCB 100. For example, the die 200 is disposed on the upper surface of the PCB 100. The die 200 may be, for example, a logic semiconductor chip.

For example, the die 200 may be an application processor (AP), such as a central processing unit (CPU), a graphics processing unit (GPU), a field-programmable gate array (FPGA), a digital signal processor, an encryption processor, a microprocessor, a microcontroller, or an application-specific integrated circuit (IC), but the present inventive concept is not limited thereto. In another example, the die 200 may be a memory chip. The die 200 may be, for example, a flash memory or a dynamic random-access memory (DRAM), but the present inventive concept is not limited thereto.

The die 200 may include one or more chip pads 210. The upper surface of the die 200 may be an active surface of the die 200. For example, the chip pads 210 may be disposed on the upper surface of the die 200. The chip pads 210 may be aligned along one side of the die 200. For example, the chip pads 210 may be aligned in the second direction D2. The chip pads 210 may be spaced apart from one another in the second direction D2. The chip pads 210 may be signal pads that are connected to integrated circuits (ICs) of the die 200 to transmit electrical signals to the die 200.

The die 200 may be wire-bonded to the PCB 100 through wire patterns 180. The wire patterns 180 may electrically connect the chip pads 210 that are on the upper surface of the die 200 with the first upper redistribution patterns 121 of the PCB 100.

The wire patterns 180 may be bonded to the chip pads 210 and the first upper redistribution patterns 121 through a stitch bonding method or a ball bonding method.

In embodiments of the present inventive concept, the dummy wire patterns 190 may be wire-bonded to the second upper redistribution patterns 123. Other sides of the dummy wire patterns 190 might not be electrically connected to other components of the semiconductor package 100A.

For example, the third upper redistribution patterns 125 of FIG. 3 may have been cut off during the manufacture of the semiconductor package 1000A. As explained earlier with reference to FIGS. 1 through 5, the other sides of the dummy wire patterns 190 are originally connected to the third upper redistribution patterns 125 of FIG. 3. Since the third upper redistribution patterns 125 are cut off during the manufacture of the semiconductor package 1000A, the other sides of the dummy wire patterns 190 might not be connected to other components. For example, the other sides of the dummy wire patterns 190 may be coplanar with the sidewalls of the semiconductor package 1000A.

At least parts of the dummy wire patterns 190 may overlap with the first solder resist film 160 in the first direction D1.

The connection terminals 300 are disposed on the other side of the PCB 100. The other side of the PCB 100 may be the lower surface of the PCB 100. The lower surface of the PCB 100 may be opposite to the surface (e.g., the upper surface of the PCB 100) on which the die 200 is disposed. The connection terminals 300 are disposed on the second side 110*b* of the substrate body part 110. The second solder resist film 170 exposes at least parts of the lower redistribution pattern 150. The exposed parts of the lower redistribution patterns 150 may be connected to the connection terminals 300. Consequently, the connection terminals 300 may be electrically connected to the first upper redistribution patterns 121. In addition, the connection terminals 300 may be electrically connected to the die 200.

The connection terminals 300 may be solder bumps including a low-melting-point metal, such as tin (Sn) and an alloy of Sn, but the present inventive concept is not limited thereto. The connection terminals 300 may have various shapes, such as a land shape, a ball shape, a pin shape, a pillar shape, a circular shape etc. The connection terminals 300 may be formed as single layers or multilayers. In a case where the connection terminals 300 are formed as single layers, the connection terminals 300 may include, for example, tin (Sn)-silver (Ag) solder or Cu. In a case where the connection terminals 300 are formed as multilayers, the connection terminals 300 may include, for example, Cu pillars and solder. The number, spacing, and arrangement of the connection terminals 300 are not particularly limited and may vary depending on the design.

The mold film 250 is disposed on the upper surface of the PCB 100. The mold film 250 is disposed on the first side 110*a* of the substrate body part 110. In addition, the mold film 250 may be disposed on the die 200. For example, the mold film 250 may completely cover the upper surface and side surfaces of the die 200. The mold film 250 may include an insulating polymer material such as an epoxy molding compound (EMC), but the present inventive concept is not limited thereto.

Semiconductor packages according to embodiments of the present inventive concept will hereinafter be described with reference to FIGS. 10 through 12. For convenience, content that overlaps with what has been described above with reference to FIGS. 6 through 9 will be briefly explained or omitted.

Figure 10:
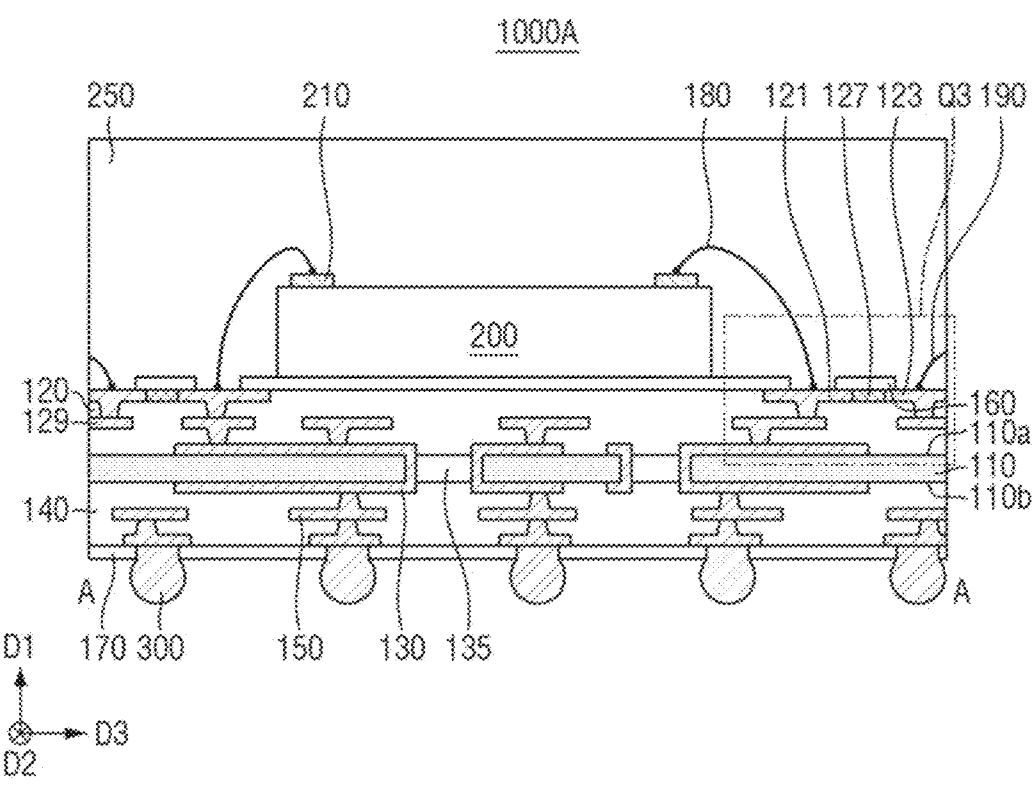
FIG. 10 is a cross-sectional view illustrating a semiconductor package according to embodiments of the present inventive concept.

FIG. 10 is a cross-sectional view illustrating a semiconductor package according to embodiments of the present inventive concept. FIG. 11 is an enlarged cross-sectional view of area Q3 of FIG. 10. FIG. 12 is a cross-sectional view illustrating a semiconductor package according to embodiments of the present inventive concept.

Figure 11:
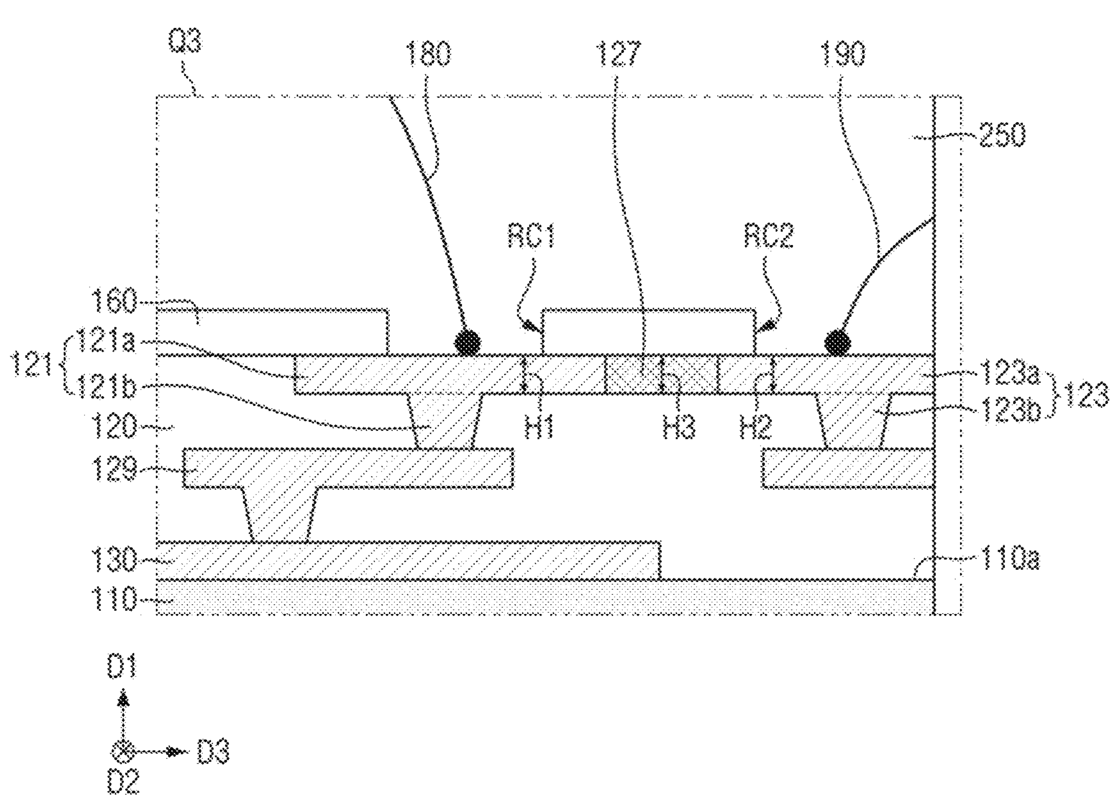
FIG. 11 is an enlarged cross-sectional view of area Q3 of FIG. 10.

Referring to FIGS. 10 and 11, in a semiconductor package 1000A, dummy wire patterns 190 might not completely overlap with a first solder resist film 160 in a first direction D1. The dummy wire patterns 190 may completely overlap with second upper redistribution patterns 123 in the first direction D1.

When manufacturing the semiconductor package 1000A, third upper redistribution patterns ("125" of FIG. 3) may be removed, and portions of the first solder resist film 160 that are interposed between second recesses ("RC2" of FIG. 3) and third recesses ("RC3" of FIG. 3) may be removed. For example, the portions of the first solder resist film 160 that are interposed between second recesses ("RC2" of FIG. 3) and third recesses ("RC3" of FIG. 3) may be completely removed. In this case, portions of the first solder resist film 160 that overlap with the dummy wire patterns 190 in the first direction D1 may be removed. For example, the portions of the first solder resist film 160 that overlap with the dummy wire patterns 190 in the first direction D1 may be completely removed. Thus, the dummy wire patterns 190 might not overlap with the first solder resist film 160 in the first direction D1.

Figure 12:
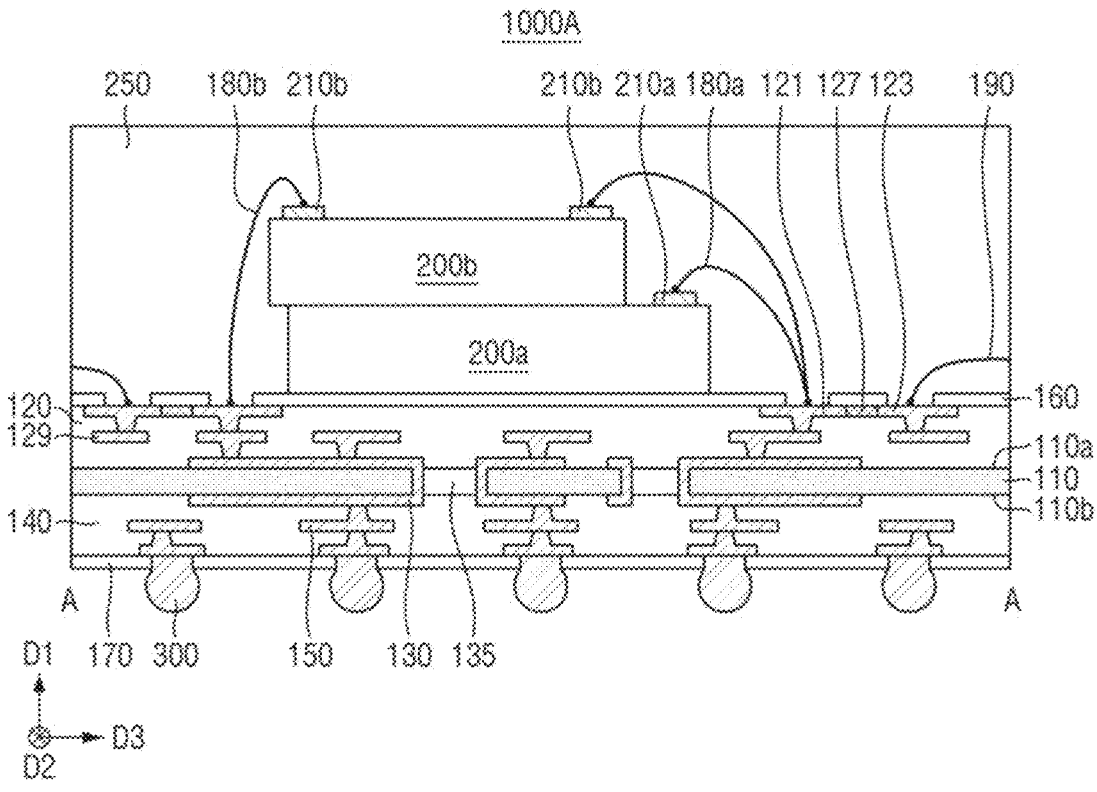
FIG. 12 is a cross-sectional view illustrating a semiconductor package according to embodiments of the present inventive concept.

Referring to FIG. 12, a lower die 200*a* and an upper die 200*b* may be provided. The lower die 200*a* may be mounted on a PCB 100. The upper die 200*b* may be mounted on the lower die 200*a*. Thus, a semiconductor package 1000A may include two or more dies. In this case, the lower die 200*a* may be a logic chip, and the upper die 200*b* may be a memory chip. However, the present inventive concept is not limited to this.

In embodiments of the present inventive concept, the lower die 200*a* and the upper die 200*b* may be arranged to form an offset stack structure. For example, at least part of the upper surface of the lower die 200*a* may be exposed by the upper die 200*b*. The lower die 200*a* may include lower chip pads 210*a*. The lower chip pads 210*a* may be on the exposed part of the upper surface of the lower die 200*a*. The upper die 200*b* may include upper chip pads 210*b*. The upper chip pads 210*b* may be disposed on the upper surface of the upper die 200*b*.

The lower die 200*a* may be wire-bonded to the PCB 100 through lower wire patterns 180*a*. The lower wire patterns 180*a* may electrically connect the lower chip pads 210*a*, which are disposed on the upper surface of the lower die 200*a*, with first upper redistribution patterns 121 of the PCB 100. The lower wire patterns 180*a* may be bonded to the lower chip pads 210*a* and the first upper redistribution patterns 121 through a stitch bonding method or a ball bonding method.

Similarly, the upper die 200*b* may be wire-bonded to the PCB 100 through upper wire patterns 180*b*. The upper wire patterns 180*b* may electrically connect the upper chip pads 210*b*, which are disposed on the upper surface of the upper die 200*b*, with the first upper redistribution patterns 121 of the PCB 100. The upper wire patterns 180*b* may be bonded to the upper chip pads 210*b* and the first upper redistribution patterns 121 through a stitch bonding method or a ball bonding method.

However, the present inventive concept is not limited thereto. In an embodiment of the present inventive concept, three or more dies 200 may be mounted on the PCB 100.

A semiconductor package according to embodiments of the present inventive concept will hereinafter be described with reference to FIGS. 13 through 16. For convenience, content that overlaps with what has been described above with reference to FIGS. 6 through 9 will be briefly explained or omitted.

Figure 13:
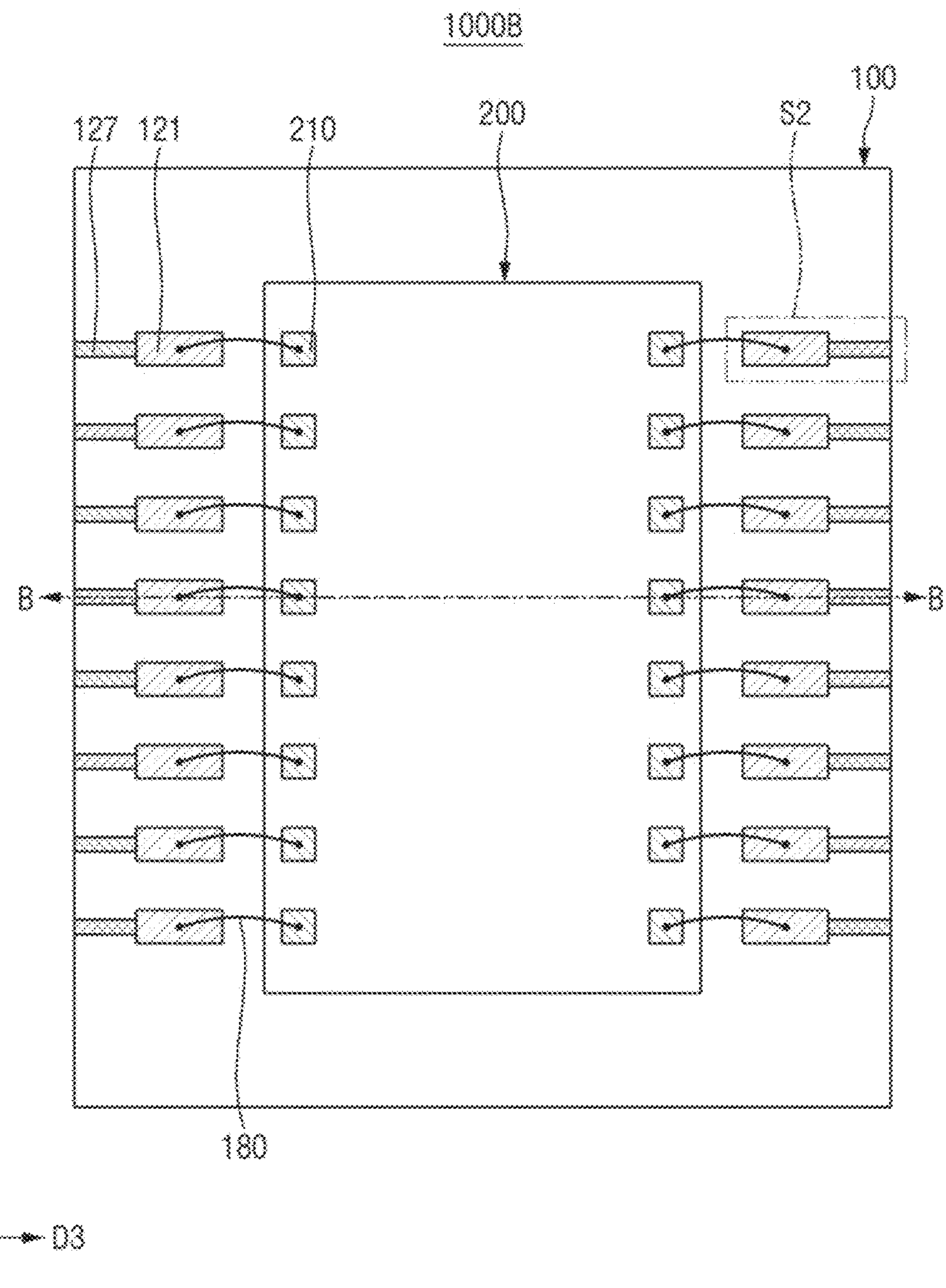
FIG. 13 is a plan view illustrating a semiconductor package according to embodiments of the present inventive concept.
Figure 14:
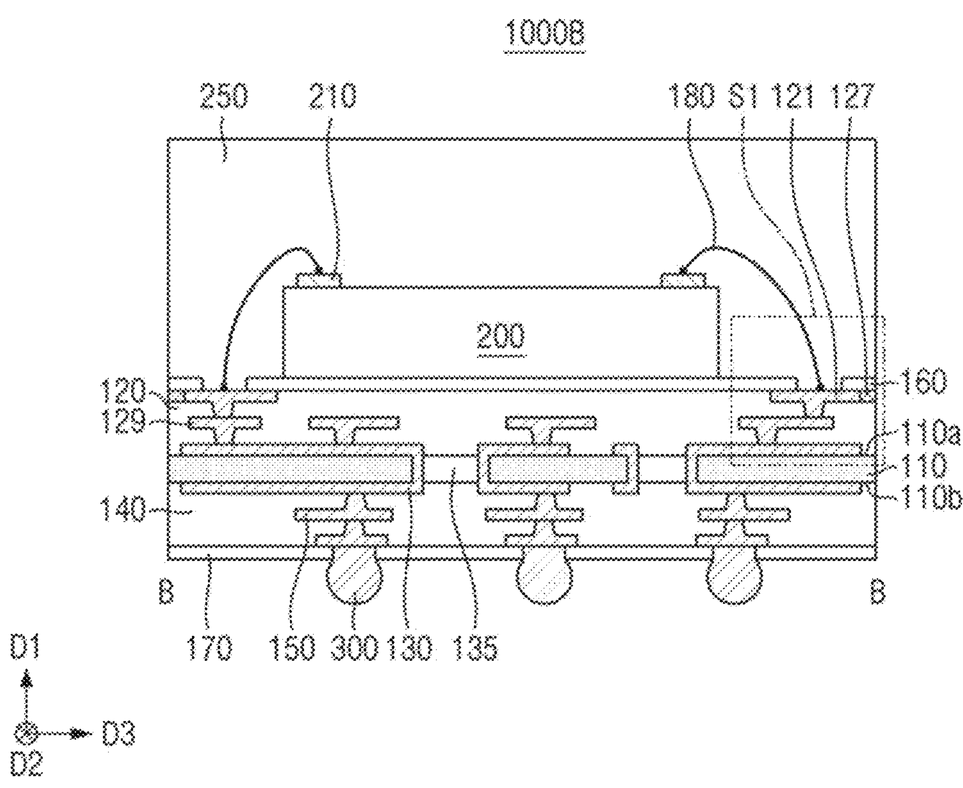
FIG. 14 is an example cross-sectional view taken along line B-B of FIG. 13.
Figure 15:
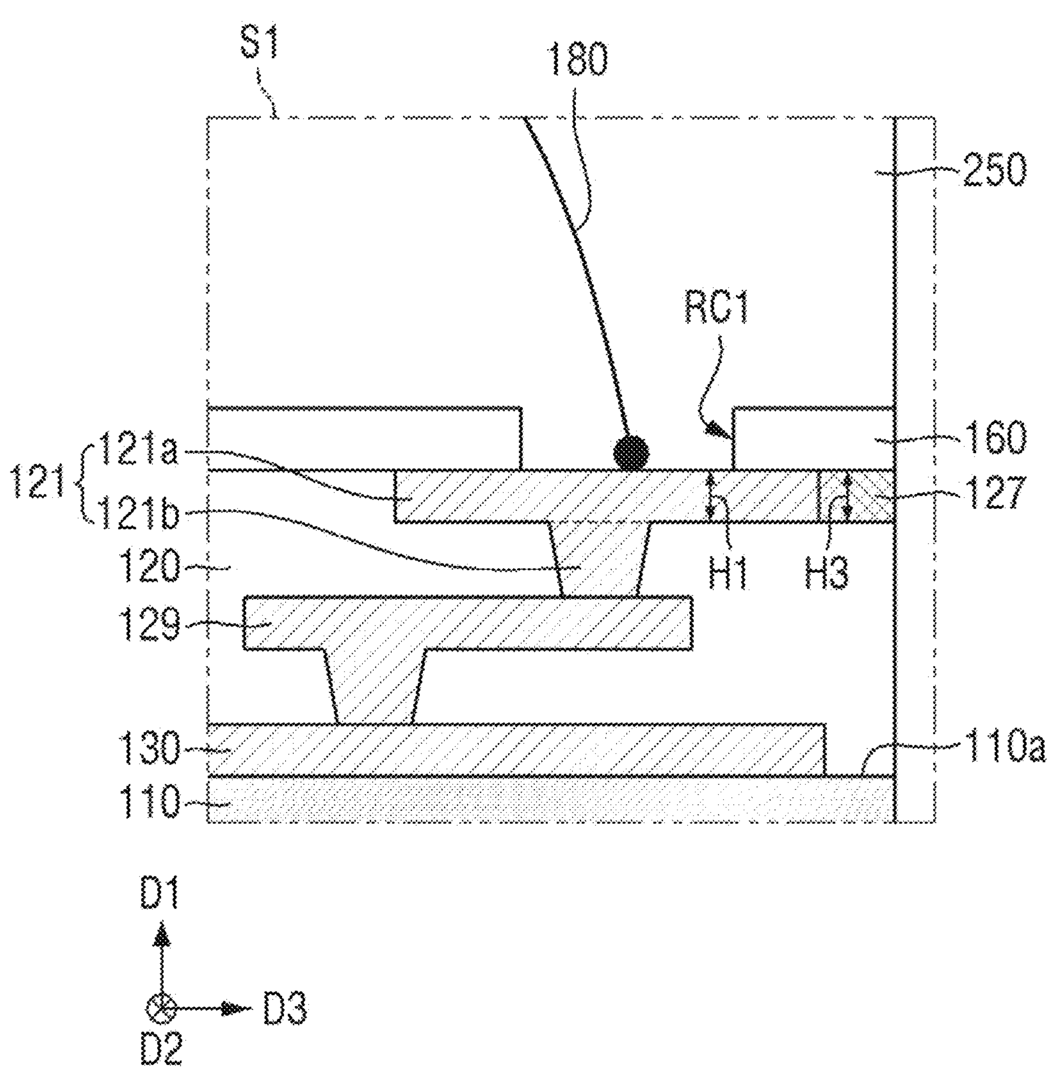
FIG. 15 is an enlarged cross-sectional view of area S1 of FIG. 14.
Figure 16:
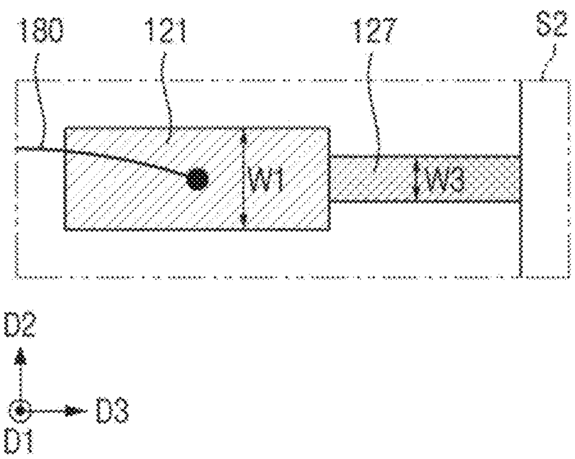
FIG. 16 is an enlarged cross-sectional view of area S2 of FIG. 13.

FIG. 13 is a plan view illustrating a semiconductor package according to embodiments of the present inventive concept. FIG. 14 is a cross-sectional view taken along line B-B of FIG. 13. FIG. 15 is an enlarged cross-sectional view of area S1 of FIG. 14. FIG. 16 is an enlarged cross-sectional view of area S2 of FIG. 13.

Referring to FIGS. 13 through 16, a semiconductor package 1000B might not include dummy wire patterns 190. Additionally, the semiconductor package 1000B might not include second upper redistribution patterns ("123" of FIG. 3).

For example, when manufacturing the semiconductor package 1000B, both the second upper redistribution patterns 123 and third upper redistribution patterns 125 may both be cut off. Dummy wire patterns ("190" of FIG. 3), which connect the second upper redistribution patterns 123 and the third upper redistribution patterns 125, may also be cut off. Consequently, the semiconductor package 1000B might not include the dummy wire patterns 190 and the second upper redistribution patterns 123.

In this case, sides of connection patterns 127 may be coplanar with the sidewalls of the semiconductor package 1000B. As previously described, a width W3 of the connection patterns 127 in a second direction D2 may be smaller than a width W1 of first upper redistribution patterns 121 in the second direction D2. However, a depth H3 of the connection patterns 127 in a first direction D1 may be substantially the same or the same as a depth H1 of the first upper redistribution patterns 121 in the first direction D1.

While the present inventive concept has been described with reference to embodiments thereof, it will be understood by those of ordinary skill in the art that various changes in form and details may be made thereto without departing from the spirit and scope of the present inventive concept.

What is claimed is:

1. A printed circuit board (PCB) comprising:

a substrate body part including a first region and a second region, and including a first side and a second side, which are opposite to each other in a first direction;

first upper redistribution patterns disposed on the first side and in the first region;

third upper redistribution patterns disposed on the first side and in the second region;

second upper redistribution patterns disposed on the first side and interposed between the first upper redistribution patterns and the third upper redistribution patterns;

connection patterns connecting the first upper redistribution patterns and the second upper redistribution patterns to each other, and disposed between the first upper redistribution patterns and the second upper redistribution patterns;

a solder resist film including first recesses, second recesses, and third recesses, which respectively expose upper surfaces of the first upper redistribution patterns, upper surfaces of the second upper redistribution patterns, and upper surfaces of the third upper redistribution patterns; and dummy wire patterns disposed within the second recesses and the third recesses and connecting the second upper redistribution patterns and the third upper redistribution patterns to each other, wherein the first upper redistribution patterns, the second upper redistribution patterns, and the third upper redistribution patterns are electrically connected to one another.

2. The PCB of claim 1, wherein at least one die is disposed in the first region.

3. The PCB of claim 2, wherein the second region is a region that is cut off during the manufacturing of a semiconductor package.

4. The PCB of claim 1, further comprising:

a plurality of lower redistribution patterns disposed on the second side of the substrate body part, wherein at least parts of the lower redistribution patterns are electrically connected to the first upper redistribution patterns, the second upper redistribution patterns, and the third upper redistribution patterns.

5. The PCB of claim 1, wherein each of a depth of each of the first upper redistribution patterns, a depth of each of the second upper redistribution patterns, and a depth of each of the third upper redistribution patterns in the first direction is substantially the same as a depth of each of the connection patterns in the first direction.

6. The PCB of claim 1, wherein a width of each of the first upper redistribution patterns in a second direction, which intersects the first direction, is greater than a width of each of the connection patterns in the second direction.

7. The PCB of claim 6, wherein the width of each of the first upper redistribution patterns in the second direction is substantially the same as a width of each of the second upper redistribution patterns in the second direction.

8. The PCB of claim 1, wherein the second upper redistribution patterns are disposed in the first region, and the dummy wire patterns are disposed at a boundary between the first and second regions.

9. The PCB of claim 1, wherein the second upper redistribution patterns are disposed in the second region, and the connection patterns are disposed at a boundary between the first and second regions.

10. A semiconductor package comprising:

a printed circuit board (PCB);

a die disposed on the PCB and connected to the PCB; and a plurality of connection terminals disposed on the PCB, wherein the PCB includes:

a substrate body part including a first side and a second side that are opposite to each other in a first direction;

first upper redistribution patterns disposed on the first side of the substrate body part;

second upper redistribution patterns disposed on the first side of the substrate body part;

a first solder resist film disposed on the first side of the substrate body part and including first recesses and second recesses that expose upper surfaces of the first upper redistribution patterns and upper surfaces of the second upper redistribution patterns;

wire patterns connecting pads of the die to the first upper redistribution patterns; and dummy wire patterns disposed in the second recesses and connected to the second upper redistribution patterns, wherein the first upper redistribution patterns and the second upper redistribution patterns are electrically connected to one another.

11. The semiconductor package of claim 10, wherein the PCB further includes a plurality of lower redistribution patterns, which are disposed on the second side of the substrate body part, and the lower redistribution patterns are electrically connected to at least parts of the first upper redistribution patterns, second upper redistribution patterns, and third upper redistribution patterns.

12. The semiconductor package of claim 11, wherein the PCB further includes a second solder resist film, which is disposed on the second side of the substrate body part and exposes at least parts of the lower redistribution patterns, and the plurality of connection terminals are connected to the parts of the lower redistribution patterns that are exposed by the second solder resist film.

13. The semiconductor package of claim 10, wherein the PCB further includes connection patterns electrically connecting the first upper redistribution patterns and the second upper redistribution patterns to each other, and disposed between the first upper redistribution patterns and the second upper redistribution patterns.

14. The semiconductor package of claim 13, wherein each of a depth of each of the first upper redistribution patterns and a depth of each of the second upper redistribution patterns in the first direction is substantially the same as a depth of each of the connection patterns in the first direction.

15. The semiconductor package of claim 13, wherein a width of each of the first upper redistribution patterns in a second direction, which intersects the first direction, is greater than a width of each of the connection patterns in the second direction.

16. The semiconductor package of claim 10, wherein a width of each of the first upper redistribution patterns in a second direction, which intersects the first direction, is substantially the same as a width of each of the second upper redistribution patterns in the second direction.

17. The semiconductor package of claim 10, wherein the dummy wire patterns do not overlap with the first solder resist film in the first direction.

18. A semiconductor package comprising:

a printed circuit board (PCB);

a die disposed on the PCB and connected to the PCB; and a plurality of connection terminals connected to the PCB, wherein the PCB includes:

a substrate body part including a first side and a second side that are opposite to each other in a first direction;

upper redistribution patterns disposed on the first side of the substrate body part;

connection patterns disposed on sides of the upper redistribution patterns;

a first solder resist film disposed on the first side of the substrate body part and including recesses that expose upper surfaces of the upper redistribution patterns; and wire patterns partially disposed in the recesses and connecting pads of the die to the upper redistribution patterns, wherein a depth of each of the connection patterns in the first direction is substantially the same as a depth of each of the upper redistribution patterns in the first direction, and a width of each of the connection patterns in a second direction, which intersects the first direction, is smaller than a width of each of the upper redistribution patterns in the second direction.

19. The semiconductor package of claim 18, wherein the PCB further includes a plurality of lower redistribution patterns, which are disposed on the second side of the substrate body part, and at least parts of the lower redistribution patterns are electrically connected to the upper redistribution patterns.

20. The semiconductor package of claim 18, wherein the PCB further includes a second solder resist film, which is disposed on the second side of the substrate body part and exposes at least parts of the lower redistribution patterns, and the plurality of connection terminals are connected to the parts of the lower redistribution patterns that are exposed by the second solder resist film.

* * * * *